(12) United States Patent
Shiraki et al.

(10) Patent No.: US 9,935,053 B2
(45) Date of Patent: Apr. 3, 2018

(54) ELECTRONIC COMPONENT INTEGRATED SUBSTRATE

(71) Applicant: SHINKO ELECTRIC INDUSTRIES CO., LTD., Nagano (JP)

(72) Inventors: Satoshi Shiraki, Nagano (JP); Koichi Tanaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/409,766

(22) Filed: Jan. 19, 2017

(65) Prior Publication Data

US 2017/0221829 A1 Aug. 3, 2017

(30) Foreign Application Priority Data

Jan. 28, 2016 (JP) ................................. 2016-014726

(51) Int. Cl.

| | |
|---|---|
| *H01L 23/538* | (2006.01) |
| *H01L 21/56* | (2006.01) |
| *H01L 23/31* | (2006.01) |
| *H05K 1/14* | (2006.01) |
| *H01L 21/48* | (2006.01) |
| *H05K 3/34* | (2006.01) |

(52) U.S. Cl.
CPC ........ *H01L 23/5389* (2013.01); *H01L 21/486* (2013.01); *H01L 21/4853* (2013.01); *H01L 21/563* (2013.01); *H01L 21/565* (2013.01); *H01L 23/3142* (2013.01); *H01L 23/5384* (2013.01); *H01L 23/5385* (2013.01); *H01L 23/5386* (2013.01); *H05K 1/144* (2013.01); *H05K 3/3436* (2013.01); *H05K 2201/042* (2013.01); *H05K 2201/10674* (2013.01); *H05K 2201/10977* (2013.01)

(58) Field of Classification Search
None
See application file for complete search history.

(56) References Cited

U.S. PATENT DOCUMENTS

| | | | |
|---|---|---|---|
| 7,989,707 B2 | 8/2011 | Yamano et al. | |
| 2008/0307642 A1* | 12/2008 | Kurashima | H01L 21/565 29/832 |

(Continued)

FOREIGN PATENT DOCUMENTS

WO 2007/069606 6/2007

*Primary Examiner* — Whitney T Moore
(74) *Attorney, Agent, or Firm* — IPUSA, PLLC

(57) ABSTRACT

An electronic component integrated substrate includes a first substrate including a first pad, a first solder resist layer provided with a first open portion that selectively exposes the first pad, and a connection pad formed on the first solder resist layer, and electrically connected to the first pad; a second substrate, stacked on the first substrate, including a second pad, and a second solder resist layer formed on the second pad and provided with a second open portion that selectively exposes the second pad; an electronic component mounted on the first substrate and sandwiched between the first substrate and the second substrate; and a substrate connection member that electrically connects the connection pad and the second pad with each other, the diameter of the connection pad being larger than each of the diameter of the first pad and the diameter of the second open portion.

7 Claims, 7 Drawing Sheets

(56) References Cited

U.S. PATENT DOCUMENTS

2015/0098204 A1\* 4/2015 Yoshikawa ....... H01L 23/49811
  361/767
2016/0351543 A1\* 12/2016 Ryu ........................ H01L 25/04

\* cited by examiner

ELECTRONIC COMPONENT INTEGRATED SUBSTRATE

CROSS-REFERENCE TO RELATED APPLICATIONS

The present application is based on and claims the benefit of priority of Japanese Priority Application No. 2016-014726 filed on Jan. 28, 2016, the entire contents of which are hereby incorporated by reference.

FIELD

The present invention relates to an electronic component integrated substrate.

BACKGROUND

Recently, in order to miniaturize a substrate including an electronic component such as a semiconductor chip, and reduce the amount of space that it occupies, an electronic component such as a semiconductor chip, a so-called electronic component integrated wiring substrate is provided in which an electronic component such as a semiconductor chip is embedded (hereinafter, referred to as an "electronic component integrated substrate").

As an example of the electronic component integrated substrate, a structure is known in which a second substrate is stacked on a first substrate on which an electronic component such as a semiconductor chip is mounted via substrate connection members such as solder balls, and resin is provided at a space between the first substrate and the second substrate to seal the space. The substrate connection members are provided between pads that are exposed in open portions of a solder resist layer formed at the first substrate, and pads that are exposed in open portions of a solder resist layer formed at the second substrate, respectively.

Here, recently, the substrate connection members are provided with a narrow pitch, and in accordance with this, a clearance between the pads of the first substrate becomes small. Thus, it is difficult to form a wiring pattern between the pads of the first substrate.

PATENT DOCUMENT

Patent Document 1: pamphlet of WO 2007/069606

SUMMARY

The present invention is made in light of the above problems, and provides an electronic component integrated substrate in which a clearance between pads of a first substrate can be ensured.

According to an embodiment, there is provided an electronic component integrated substrate including: a first substrate including a first pad, a first solder resist layer formed on the first pad and provided with a first open portion that selectively exposes the first pad, and a connection pad formed on the first solder resist layer, and electrically connected to the first pad via a conductive material provided in the first open portion; a second substrate including a second pad, and a second solder resist layer formed on the second pad and provided with a second open portion that selectively exposes the second pad, the second substrate being stacked on the first substrate while facing the second pad toward the connection pad; an electronic component mounted on the first substrate and sandwiched between the first substrate and the second substrate; and a substrate connection member that electrically connects the connection pad and the second pad with each other, the diameter of the connection pad being larger than each of the diameter of the first pad and the diameter of the second open portion.

BRIEF DESCRIPTION OF DRAWINGS

Other objects, features and advantages of the present invention will become more apparent from the following detailed description when read in conjunction with the accompanying drawings.

DESCRIPTION OF EMBODIMENTS

Figure 1A:
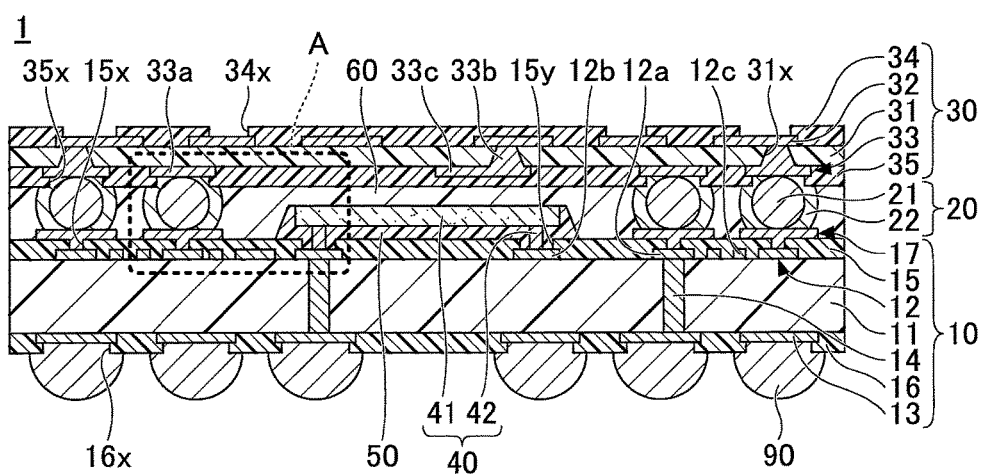
FIG. 1A and FIG. 1B are cross-sectional views illustrating an example of an electronic component integrated substrate of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes. It is to be noted that, in the explanation of the drawings, the same components are given the same reference numerals, and explanations are not repeated.

First Embodiment (Structure of Electronic Component Integrated Substrate of First Embodiment)

Figure 1B:
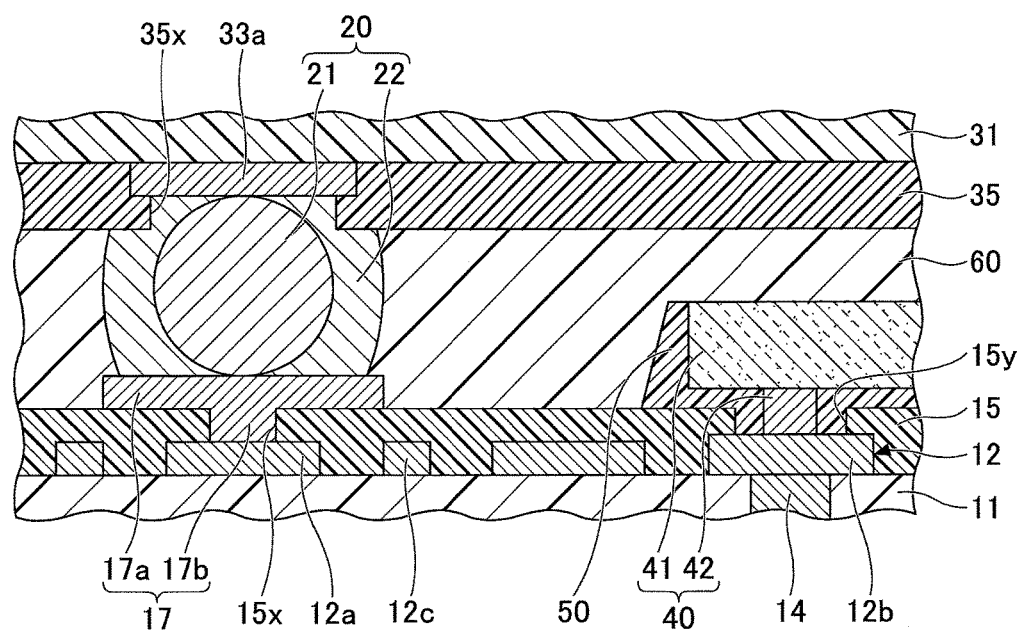

First, a structure of an electronic component integrated substrate of the first embodiment is explained. FIG. 1A and FIG. 1B are cross-sectional views illustrating an example of an electronic component integrated substrate 1 of the first embodiment, wherein FIG. 1B is a view in which a portion "A" of FIG. 1A is enlarged.

With reference to FIG. 1A and FIG. 1B, the electronic component integrated substrate 1 includes a first substrate 10, substrate connection members 20, a second substrate 30, a semiconductor chip 40, underfill resin 50 and mold resin 60. In the electronic component integrated substrate 1, the first substrate 10 and the second substrate 30 are stacked via the substrate connection members 20 that electrically connect the first substrate 10 and the second substrate 30.

In this embodiment, in the electronic component integrated substrate 1, for explanatory purposes, a solder resist layer 34 side of the second substrate 30 is referred to as an upper side or one side, and a solder resist layer 16 side of the first substrate 10 is referred to as a lower side or the other side. Further, a surface of each component at the solder resist layer 34 side is referred to as one surface or an upper surface, and a surface of each component at the solder resist layer 16 side is referred to as the other surface or a lower surface. However, the electronic component integrated substrate 1 may be used in an opposite direction or may be used at an arbitrary angle. Further, in this embodiment, "in a planar view" means that an object is seen in a direction that is normal to one surface of the solder resist layer 34, and a "planar shape" means a shape of an object seen in the direction that is normal to the one surface of solder resist layer 34.

The first substrate 10 includes an insulating layer 11, wiring layers 12 and 13, through wirings 14, solder resist layers 15 and 16 and substrate connection portions 17.

In the first substrate 10, a so-called glass epoxy board or the like in which insulating resin such as epoxy based resin is impregnated in a glass cloth may be used as the insulating layer 11, for example. Alternatively, a fabric such as glass fiber, carbon fiber or aramid fiber, a substrate in which insulating resin such as epoxy based resin or polyimide based resin is impregnated in a woven fabric or a nonwoven fabric may be used as the insulating layer 11. The thickness of the insulating layer 11 may be about 30 to 200 µm, for example. Here, the glass cloth or the like is not illustrated in each of the drawings.

The wiring layer 12 is formed at one surface of the insulating layer 11. For the material of the wiring layer 12, copper (Cu) or the like may be used, for example. The thickness of the wiring layer 12 may be about 5 to 20 µm, for example. The wiring layer 12 includes first pads 12a, connection pads 12b and wiring patterns 12c. In other words, the connection pads 12b are formed at a same layer level as the first pads 12a and the wiring patterns 12c. The planar shape of the first pad 12a may be a circular shape whose diameter is about 60 to 80 µm, for example. The planar shape of the connection pad 12b may be a circular shape whose diameter is about 20 to 120 µm, for example.

The wiring pattern 12c may be provided between the adjacent first pads 12a, for example. The line/space of the wiring patterns 12c may be about, 10 µm/10 µm to 10 µm/90 µm, for example. Here, the "line" of line/space means the width of a wiring, and the "space" means a space between the adjacent wirings (wiring space). For example, if the line/space is 10 µm/10 µm, this means that the width of the wiring is 10 µm and a space between the adjacent wirings is 10 µm.

The wiring layer 13 is formed at the other surface of the insulating layer 11. The wiring layer 12 and the wiring layer 13 are electrically connected with each other via the through wirings 14 that penetrate the insulating layer 11. Here, one end of the through wiring 14 may be connected to either of the first pad 12a, the connection pad 12b and the wiring pattern 12c. For the material of the wiring layer 13 and the through wirings 14, copper (Cu) or the like may be used, for example. The thickness of the wiring layer 13 may be about 5 to 20 µm, for example.

The solder resist layer 15 is formed at the one surface of the insulating layer 11 so as to cover the wiring layer 12. The solder resist layer 15 is provided with open portions 15x for selectively exposing the first pads 12a, respectively, and open portions 15y for selectively exposing the connection pads 12b, respectively. The solder resist layer 15 is a typical example of a first solder resist layer of the invention. Further, the open portion 15x is a typical example of a first open portion of the invention, and the open portion 15y is a typical example of a third open portion of the invention.

The solder resist layer 16 is formed at the other surface of the insulating layer 11 so as to cover the wiring layer 13. The solder resist layer 16 is provided with open portions 16x for selectively exposing the wiring layer 13. The wiring layer 13 that is exposed in each of the open portions 16x functions as a pad to be electrically connected to a mounting substrate or the like such as a motherboard (not illustrated in the drawings).

For the material of the solder resist layers 15 and 16, photosensitive epoxy based insulating resin, acrylic based insulating resin or the like may be used, for example. The thickness of each of the solder resist layers 15 and 16 may be about 10 to 40 µm, for example. The planar shape of the open portion 15x may be a circular shape whose diameter is about 40 to 60 µm, for example. The depth of the open portion 15x may be about 5 to 20 µm, for example.

As necessary, a metal layer may be formed on the wiring layer 13 exposed in each of the open portions 16x, or an organic coating made of an azole compound, an imidazole compound or the like may be formed on the wiring layer 13 exposed in each of the open portions 16x by an antioxidation process such as an Organic Solderability Preservative (OSP) process. For the material of the metal layer, an Au layer, a Ni/Au layer (a metal layer in which a Ni layer and an Au layer are stacked in this order), a Ni/Pd/Au layer (a metal layer in which a Ni layer, a Pd layer and an Au layer are stacked in this order) or the like may be used. Further, external connection terminals 90 such as solder balls may be formed at the wiring layer 13 that is exposed in the open portions 16x, respectively.

The substrate connection portion 17 includes a connection pad 17a that is formed at one surface of the solder resist layer 15 and a via wiring 17b that is integrally formed with the connection pad 17a and is filled in the open portion 15x. A lower surface of the connection pad 17a contacts the solder resist layer 15, and an upper surface and a side surface of the connection pad 17a are exposed from the solder resist layer 15. The connection pad 17a is electrically connected to the respective first pad 12a via the via wiring 17b formed in the open portion 15x. The connection pad 17a, the via wiring 17b and the first pad 12a are overlapped in a planar view. A part of or all of the wiring pattern 12c may be provided to overlap the connection pad 17a in a planar view.

The planar shape of the connection pad 17a may be a circular shape whose diameter is about 80 to 240 µm, for example. The thickness of the connection pad 17a may be about 5 to 105 µm, for example. The connection pad 17a may be formed to have a columnar shape (metal post) that is thicker than the first pad 12a. In such a case, even when the substrate connection member 20 with a smaller diameter is used, a space between the first substrate 10 and the second substrate 30 can be ensured.

The planar shape of the via wiring 17b (=planar shape of the open portion 15x) may be a circular shape whose diameter is about 40 to 60 µm, for example. The thickness of the via wiring 17b (=the depth of the open portion 15x) may be about 5 to 20 µm, for example.

Here, according to the electronic component integrated substrate 1, the diameter of the connection pad 17a is designed to be larger than the diameter of the first pad 12a.

Further, the diameter of the connection pad 17a is designed to be larger than the diameter of the open portion 35x, which will be described later.

The semiconductor chip 40 is flip-chip mounted on the solder resist layer 15 of the first substrate 10 in a face-down manner (facing a circuit forming surface to the one surface of the first substrate 10). More specifically, the semiconductor chip 40 includes a chip body 41 provided with a semiconductor integrated circuit, and protruding electrodes 42, which are connection terminals. The protruding electrodes 42 of the semiconductor chip 40 are electrically connected to the connection pads 12b of the first substrate 10 in the open portions 15y, respectively, by solder or the like (not illustrated in the drawings). For the protruding electrode 42, a gold bump, a copper post with solder or the like may be used, for example. The height of the protruding electrode 42 may be about 20 to 30 μm, for example. The thickness of the semiconductor chip 40 may be about 50 to 100 μm, for example.

The electronic component included (integrated) in the electronic component integrated substrate 1 is not limited to a semiconductor chip, and a passive element such as a capacitor, an inductor or a resistor may be included instead of the semiconductor chip. Further, a so-called Chip Size Package (CSP) in which a rewiring is formed in a semiconductor chip may be included. Alternatively, these may be mixed.

The underfill resin 50 is filled between the circuit forming surface (a surface at the protruding electrode 42 side) of the semiconductor chip 40 and the one surface of the first substrate 10. The underfill resin 50 is formed to extend at each of the side surfaces of the semiconductor chip 40. The back surface of the semiconductor chip 40 (an opposite surface of the circuit forming surface, and a surface facing the second substrate 30) is exposed from the underfill resin 50. For the material of the underfill resin 50, insulating resin such as a thermosetting epoxy based resin may be used, for example. The underfill resin 50 may include fillers such as silica ($SiO_2$).

The second substrate 30 includes an insulating layer 31, wiring layers 32 and 33, and solder resist layers 34 and 35.

In the second substrate 30, the insulating layer 31 is provided with via holes 31x. The via hole 31x may be a concave portion that is open at a solder resist layer 35 side and a bottom surface thereof is composed by the other surface of the wiring layer 32 and has a cone trapezoid shape in which the dimension of the open is larger than the dimension of the bottom surface. The material of the insulating layer 31 may be the same as that of the insulating layer 11, for example.

The wiring layer 32 is formed at the one surface of the insulating layer 31. For the material of the wiring layer 32, copper (Cu) or the like may be used, for example. The thickness of the wiring layer 32 may be about 10 to 25 μm, for example.

The wiring layer 33 is formed at the other side of the insulating layer 31. For the material of the wiring layer 33, copper (Cu) or the like may be used, for example. The wiring layer 33 includes second pads 33a for connecting the substrate connection members 20 and wiring patterns 33c. The thickness of the second pad 33a and the wiring pattern 33c may be about 10 to 25 μm, for example. The planar shape of the second pad 33a may be a circular shape whose diameter is about 90 to 140 μm, for example. All of or a part of the second pads 33a and the wiring patterns 33c are electrically connected to the wiring layer 32 via wirings 33b that are integrally formed with the second pad 33a or the wiring pattern 33c and filled in the via holes 31x, respectively.

The solder resist layer 34 is formed at the one surface of the insulating layer 31 so as to cover the wiring layer 32. The solder resist layer 34 is provided with open portions 34x that selectively expose the wiring layer 32. The wiring layer 32 that is exposed in the open portions 34x functions as pads that are electrically connected to an electronic component such as a semiconductor chip or a semiconductor package (not illustrated in the drawings).

The solder resist layer 35 is formed at the other surface of the insulating layer 31 so as to cover the wiring layer 33. The solder resist layer 35 is provided with open portions 35x that selectively expose the second pads 33a, respectively. The solder resist layer 35 is a typical example of a second solder resist layer of the invention. Further, the open portion 35x is a typical example of the second open portion of the invention.

For the material of the solder resist layers 34 and 35, photosensitive epoxy based insulating resin, acrylic based insulating resin or the like may be used, for example. The thickness of each of the solder resist layers 34 and 35 may be about 20 to 50 μm, for example. The planar shape of the open portion 35x may be a circular shape whose diameter is about 70 to 120 μm, for example. The depth of the open portion 35x may be about 10 to 25 μm, for example.

As necessary, similar to the wiring layer 13 exposed in the open portions 16x, a metal layer or an organic coating may be formed on the wiring layer 32 exposed in the open portions 34x.

The substrate connection member 20 is an electric conductive member that is formed in a substantially spherical shape. The second substrate 30 is stacked on the first substrate 10 while facing the second pads 33a toward the connection pads 17a and sandwiching the semiconductor chip 40 with the first substrate 10. At this time, the connection pads 17a and the second pads 33a are electrically connected with each other via the substrate connection members 20, respectively.

When each of the first substrate 10 and the second substrate 30 has a substantially rectangular shape in a planar view, the substrate connection members 20 may be provided at peripheral portions of the first substrate 10 and the second substrate 30, for example. The substrate connection members 20 may be aligned in a single column, or may be aligned in a plurality of columns. The substrate connection members 20 electrically connect the first substrate 10 and the second substrate 30, and have a function to ensure a predetermined space (gap) between the first substrate 10 and the second substrate 30.

In this embodiment, as an example, a solder ball with a core is used as the substrate connection member 20. The substrate connection member 20 includes a core 21 having a substantially spherical shape and a conductive material 22 that covers a circumferential surface of the core 21. The core 21 is provided to contact an upper surface of the connection pad 17a and a lower surface of the second pad 33a. Thus, the distance between the upper surface of the connection pad 17a and the lower surface of the second pad 33a becomes the same as the diameter of the core 21.

For the core 21, a metal core made of a metal such as copper, a resin core made of resin or the like may be used, for example. For the conductive material 22, a solder material such as alloy containing Pb, alloy containing Sn and Cu, alloy containing Sn and Sb, alloy containing Sn and Ag, alloy containing Sn, Ag and Cu may be used, for example.

The diameter of the core 21 may be about 60 to 160 μm, for example. Further, the diameter of the conductive material 22 before being melted may be about 90 to 200 μm, for example.

Here, the substrate connection member 20 is not limited to the solder ball with the core including the core 21 and the conductive material 22 that covers the circumferential surface of the core 21, and a solder ball not including a core may be used, for example. When the solder ball not including the core or the like is used, the distance between the first substrate 10 and the second substrate 30 may be controlled using a predetermined jig when manufacturing the electronic component integrated substrate 1.

The mold resin 60 is filled between facing surfaces of the first substrate 10 and the second substrate 30 so as to seal the substrate connection members 20, the semiconductor chip 40 and the underfill resin 50. The mold resin 60 covers a side surface of each of the connection pads 17a. For the mold resin 60, insulating resin such as thermosetting epoxy based resin containing fillers may be used, for example.

In the electronic component integrated substrate 1, the connection pad 17a is formed on the solder resist layer 15, and the connection pad 17a is electrically connected to the first pad 12a via a conductive material (the via wiring 17b) provided in the open portion 15x. Then, the diameter of the connection pad 17a is designed to be larger than the diameter of the first pad 12a. By enlarging the diameter of the connection pad 17a, it is possible to use the substrate connection member 20 whose diameter is relatively large, and the space for filling the mold resin 60 above the semiconductor chip 40 can be easily retained. With this, a risk of insufficient filling of the mold resin 60 due to the fact that the space between the semiconductor chip 40 and the second substrate 30 is small can be reduced. Here, due to the height increasing by the connection pad 17a, even when the substrate connection member 20 whose diameter is smaller than that of a conventional one is used, the space between the semiconductor chip 40 and the second substrate 30 can be sufficiently retained. Further, the substrate connection members 20 can be provided with a narrow pitch.

Further, by enlarging the diameter of the connection pad 17a, an allowable amount of a positional shift when mounting the second substrate 30 on the first substrate 10 may be increased. Further, as a solder resist layer is not formed on the connection pad 17a, different from the conventional structure, there is no risk that the substrate connection member 20 is formed on the solder resist layer.

Figure 2A:
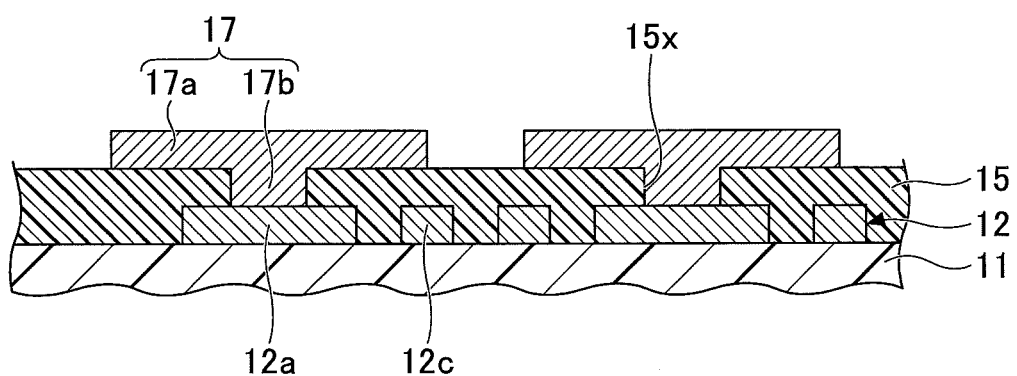
FIG. 2A and FIG. 2B are views for describing an effect of providing substrate connection portions.

Further, as illustrated in FIG. 2A (a partially enlarged view of FIG. 1A), in the electronic component integrated substrate 1, the connection pad 17a is formed on the solder resist layer 15, and the connection pad 17a is electrically connected to the first pad 12a via the via wiring 17b formed in the open portion 15x. Thus, it is preferable because the diameter of the connection pad 17a and the diameter of the first pad 12a can be independently designed. This merit is described in the following with reference to a comparative example as well.

Figure 2B:
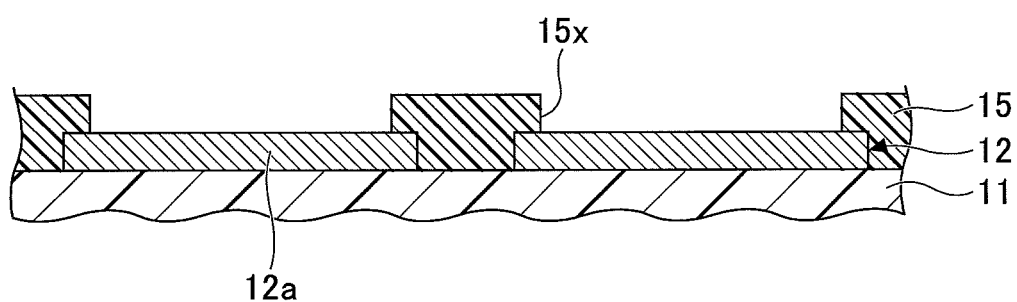

FIG. 2B illustrates an electronic component integrated substrate of a comparative example. In the comparative example, the connection pad 17a is not formed on the solder resist layer 15. Thus, the first pad 12a that is exposed in each of the open portions 15x of the solder resist layer 15 becomes a connection pad to be connected to the second substrate 30. In such a case, if the substrate connection member 20 is formed to have a large diameter, it is necessary to enlarge the diameter of the first pad 12a in accordance with the diameter of the substrate connection member 20. Thus, it is difficult to retain a clearance between the adjacent first pads 12a, and it is impossible to provide the wiring pattern 12c between the adjacent first pads 12a.

On the other hand, according to the electronic component integrated substrate 1 of FIG. 2A, the diameter of the connection pad 17a and the diameter of the first pad 12a are independently designed. Thus, even when the diameter of the connection pad 17a is large, the diameter of the first pad 12a can be made small. With this, when the diameter of the substrate connection member 20 is made larger, and even when the diameter of the connection pad 17a is made larger, the diameter of the first pad 12a can be retained small. Thus, it is possible to ensure a clearance between the adjacent first pads 12a, and the wiring pattern 12c can be provided between the adjacent first pads 12a.

Here, the diameter of the first pad 12a may be smaller than the diameter of the open portion 35x. Further, the diameter of the first pad 12a may be smaller than the diameter of the second pad 33a. Further, the diameter of the first pad 12a may be smaller than the diameter of the substrate connection member 20. Further, the diameter of the first pad 12a may be smaller than the diameter of the core 21. As such, by providing the connection pad 17a, the diameter of the first pad 12a can be made smaller than the diameter of any components regarding the connection between the first substrate 10 and the second substrate 30. Thus, it is easy to provide the wiring pattern 12c between the adjacent first pads 12a.

Further, in the electronic component integrated substrate 1, the diameter of the connection pad 17a is designed to be larger than the diameter of the open portion 35x. As will be described later, the substrate connection members 20 are bonded to the second substrate 30 first, and thereafter, the substrate connection members 20 are bonded to the first substrate 10. If the diameter of the open portion 35x is made larger, a large amount of the conductive material 22 is bonded to the respective second pad 33a when bonding the substrate connection member 20 to the second substrate 30, and the amount of the conductive material 22 to be bonded to the respective connection pad 17a is reduced when bonding the substrate connection member 20 to the first substrate 10. As a result, reliability in connection between the substrate connection member 20 and the respective connection pad 17a is lowered. By reducing the diameter of the open portion 35x to a certain extent, and making the diameter of the connection pad 17a large, the conductive material 22 can be sufficiently bonded to the respective connection pad 17a and reliability in connection between the substrate connection member 20 and the respective connection pad 17a can be improved.

Further, it is preferable to make the diameter of the substrate connection member 20 to be larger than the diameter of the open portion 35x in increasing reliability in connection. In such a case, when bonding the first substrate 10 and the second substrate 30, the amount of the conductive material 22 that bonds to the connection pad 17a side increases and the reliability in connection is improved.

Further, it is preferable to make the diameter of the core 21 of the substrate connection member 20 to be larger than the diameter of the open portion 35x in increasing reliability in connection. In such a case, when the conductive material 22 is melted and the substrate connection member 20 is mounted on the second substrate 30, a positional shift of the substrate connection member 20 with respect to the second pad 33a can be prevented because the core 21 contacts an edge of the open portion 35x. Thus, when bonding the first substrate 10 and the second substrate 30, the positional shift between the connection pad 17a and the substrate connection member 20 can be prevented as well, and the reliability in connection between the first substrate 10 and the second substrate 30 is improved.

(Method of Manufacturing Electronic Component Integrated Substrate of First Embodiment)

Next, a method of manufacturing the electronic component integrated substrate 1 of the first embodiment is described. FIG. 3A to FIG. 4D are views illustrating an example of manufacturing steps of the electronic component integrated substrate 1 of the first embodiment.

In a step illustrated in FIG. 3A to FIG. 3D, the first substrate 10 is manufactured. First, in a step illustrated in FIG. 3A, portions except the substrate connection portions 17 are manufactured. For example, a glass epoxy board provided with copper films at both surfaces (a substrate in which copper films are provided at both surfaces of the insulating layer 11) is prepared. Then, through holes that penetrate the both surfaces are formed in the glass epoxy board provided with the copper films by laser processing, drilling or the like. Thereafter, a plating layer (an electroless plating layer and an electrolytic copper plating layer) is formed at an inner wall of each of the through holes and at a surface of each of the copper films. Next, the copper film and the plating layer are patterned by etching, and the wiring layer 12, the wiring layer 13 and the through wiring 14 are formed. The material and the thickness of each of the wiring layer 12, the wiring layer 13 and the through wiring 14 are as described above.

Next, the solder resist layer 15 that covers the wiring layer 12 is formed at the one surface of the insulating layer 11. The solder resist layer 16 that covers the wiring layer 13 is formed at the other surface of the insulating layer 11. The solder resist layers 15 and 16 may be formed by coating liquid or paste insulating resin such as photosensitive epoxy based resin at the one surface and the other surface of the insulating layer 11, respectively, by screen printing, roll coating, spin coating or the like, for example. Alternatively, instead of coating the liquid or paste resin, film insulating resin such as photosensitive epoxy based resin may be laminated, for example.

Then, by exposing and developing the coated or laminated insulating resin, the open portions 15x and 15y, and the open portions 16x are formed in the solder resist layers 15 and 16, respectively (photolithography). Alternatively, the open portions 15x and 15y, and the open portions 16x may be formed by laser processing or blasting. The thickness of each of the solder resist layers 15 and 16 and the shape or the like of each of the open portions are as described above.

Figure 3A:
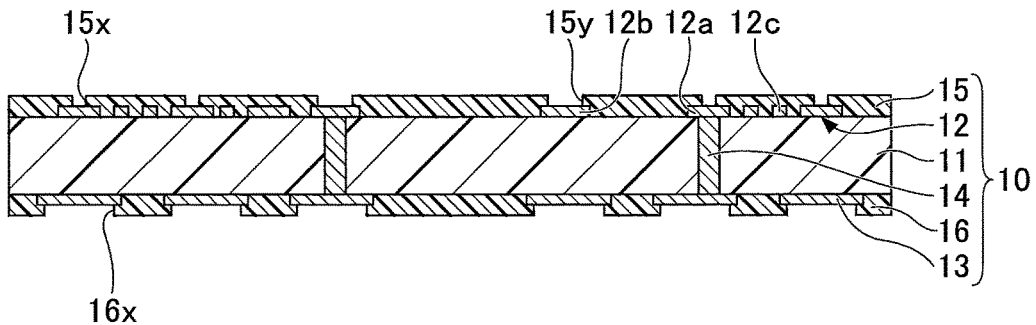
FIG. 3A to FIG. 3D are views illustrating an example of manufacturing steps of the electronic component integrated substrate of the first embodiment.
Figure 3B:
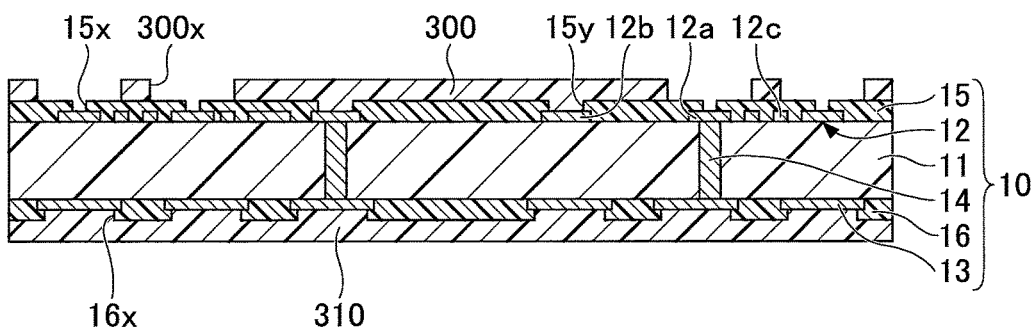
Figure 3C:
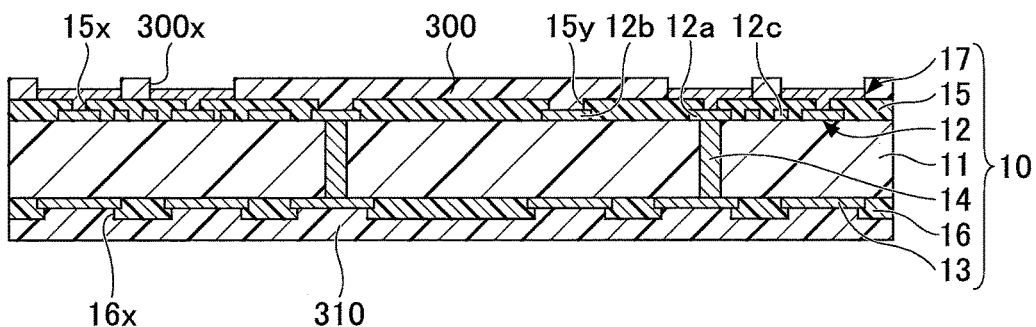
Figure 3D:
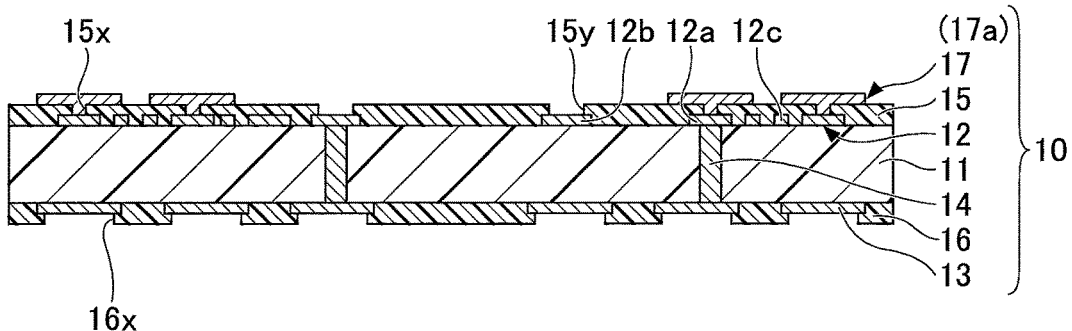

Next, in a step illustrated in FIG. 3B to FIG. 3D, the substrate connection portions 17 are formed. In order to form the substrate connection portions 17, first, a seed layer is formed at the entire surface of the solder resist layer 15 including insides of the open portions 15x and the open portions 15y by a sputtering method or the like. For the seed layer, a stacked layer film in which a copper film is stacked on a titanium film may be used, for example.

Next, as illustrated in FIG. 3B, a photosensitive resist layer 300 is formed on the entire surface of the seed layer (not illustrated in the drawings). Further, a resist layer 310 is formed on the entire surface of the solder resist layer 16. Then, open portions 300x are formed in the resist layer 300 by exposing and developing to expose parts of the seed layer, at which the connection pads 17a of the substrate connection portions 17 are formed, in the open portions 300x, respectively. Open portions are not provided in the resist layer 310.

Next, as illustrated in FIG. 3C, electrolytic plating made of copper (Cu) or the like is deposited on the seed layer exposed in the open portions 300x by electroplating using the seed layer as a power supply layer to form an electrolytic plating layer.

Next, as illustrated in FIG. 3D, the resist layer 300 is removed and the seed layer that is not covered by the electrolytic plating layer is removed by etching by using the electrolytic plating layer as a mask. With this, the substrate connection portions 17 in which the electrolytic plating layer is stacked on the seed layer are formed. As necessary, upper surfaces of the connection pads 17a of the substrate connection portions 17 may be flattened by Chemical Mechanical Polishing (CMP) or the like. The substrate connection portion 17 formed by the above described manufacturing steps has a structure in which the electrolytic plating layer is stacked on the seed layer. However, in each of the drawings, the seed layer is not illustrated.

Figure 4A:
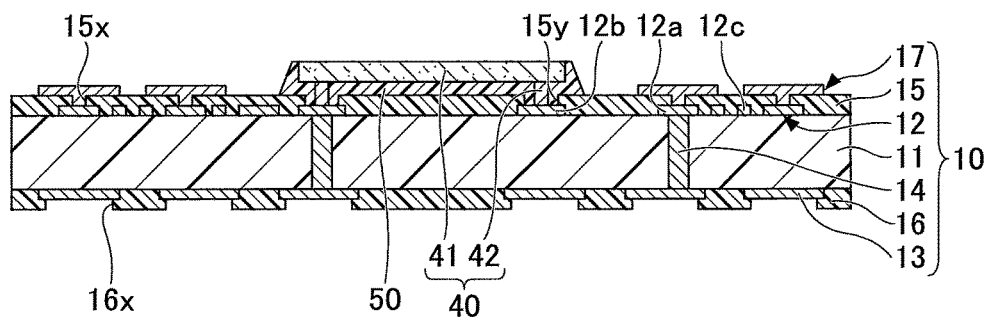
FIG. 4A to FIG. 4D are views illustrating an example of the manufacturing steps of the electronic component integrated substrate of the first embodiment.

Next, in a step illustrated in FIG. 4A, the semiconductor chip 40 is flip-chip mounted on the first substrate 10 and the underfill resin 50 is formed. Specifically, the semiconductor chip 40 including the chip body 41 provided with the semiconductor integrated circuit and the protruding electrodes 42, which are connection terminals, is prepared. Then, the semiconductor chip 40 is placed on the first substrate 10 in a face-down manner. Then, the protruding electrodes 42 of the semiconductor chip 40 are connected to the connection pads 12b by solder, respectively. Thereafter, the underfill resin 50 is filled between the circuit forming surface of the semiconductor chip 40 and the one surface of the first substrate 10.

Here, alternatively, film underfill resin 50 may be formed on the first substrate 10 first, and then the semiconductor chip 40 may be pushed toward the underfill resin 50 to connect the protruding electrodes 42 to the connection pads 12b, respectively.

Figure 4B:
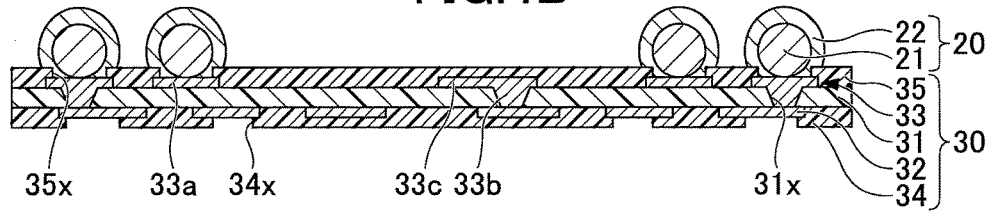

Next, in a step illustrated in FIG. 4B, the second substrate 30 is manufactured, and the substrate connection members 20 are mounted on the second pads 33a of the second substrate 30, respectively. Specifically, the insulating layer 31 using a so-called glass epoxy board or the like is prepared, and the wiring layer 32 is formed at the one surface of the insulating layer 31. Next, the via holes 31x that expose the other surface of the wiring layer 32 are formed in the insulating layer 31 by laser processing or the like, and the wiring layer 33 is formed at the other surface of the insulating layer 31. The wiring layer 32 and the wiring layer 33 are electrically connected via the via wirings formed in the via holes 31x, respectively, by filling a part of the wiring layer 33.

It is preferable to perform a desmear process, after forming the via holes 31x, to remove resin residue that is adhered at a surface of the wiring layer 32 that is exposed at a bottom portion of each of the via holes 31x. The wiring layers 32 and 33 may be formed by various wiring forming methods such as a semi-additive method or a subtractive method. Next, similar to the step illustrated in FIG. 3A, the solder resist layers 34 and 35 are formed, and further, the open portions 34x and 35x are formed. With this, the second substrate 30 is completed.

Next, the substrate connection members 20 are mounted on the second pads 33a exposed in the open portions 35x of the solder resist layer 35 of the second substrate 30, respectively. Then, the structure is heated to a predetermined temperature to melt the conductive materials 22 composing the substrate connection members 20, thereafter, to cure and to be bonded to the second pads 33a, respectively. The cores 21 of the connection members 20 contact the second pads 33a, respectively. The second pads 33a and the substrate connection members 20 may be provided at peripheral portions of the second substrate 30.

Figure 4C:
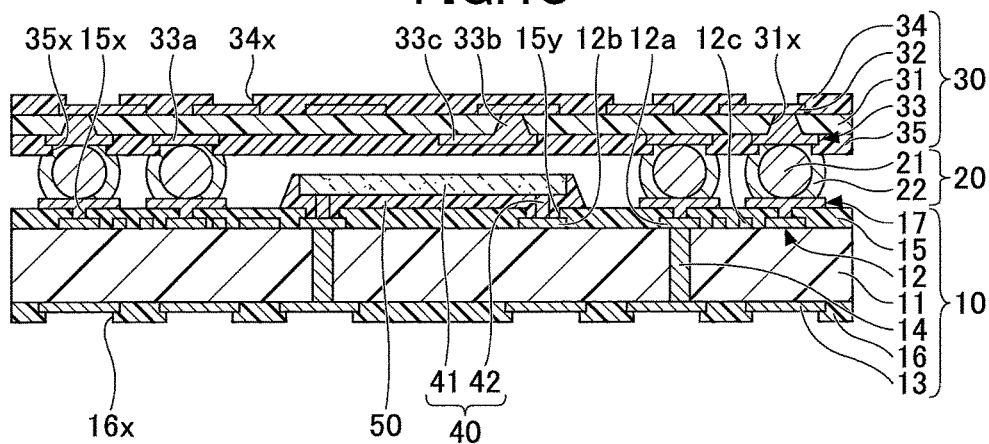

Next, in a step illustrated in FIG. 4C, the first substrate 10 on which the semiconductor chip 40 is mounted manufactured in the step of FIG. 4A, and the second substrate 30 on which the substrate connection members 20 are mounted manufactured in the step of FIG. 4B are prepared. Then, the second substrate 30 is stacked on the first substrate 10 such that the conductive materials 22 of the substrate connection members 20 contact the upper surfaces of the connection pads 17a of the substrate connection portions 17, respectively. This means that the second substrate 30 is stacked on the first substrate 10 such that the semiconductor chip 40 and the underfill resin 50, and the substrate connection members 20 face with each other at inside.

Then, while heating the conductive materials 22, the second substrate 30 is pushed toward the first substrate 10. With this, the upper side of the core 21 of each of the substrate connection members 20 contacts the lower surface of the respective second pad 33a of the second substrate 30 while the lower side of the core 21 each of the substrate connection members 20 contacting the upper surface of the respective connection pad 17a of the first substrate 10. Under this status, the first substrate 10 and the second substrate 30 are electrically connected with each other via the substrate connection members 20. Further, a predetermined space is retained between the first substrate 10 and the second substrate 30 by the core 21 of each of the substrate connection members 20.

By making the diameter of the connection pad 17a to be larger than the diameter of the first pad 12a or the diameter of the open portion 35x, the allowable amount of the positional shift when mounting the second substrate 30 on the first substrate 10 is increased. Thus, the second substrate 30 can be easily stacked on the first substrate 10.

Figure 4D:
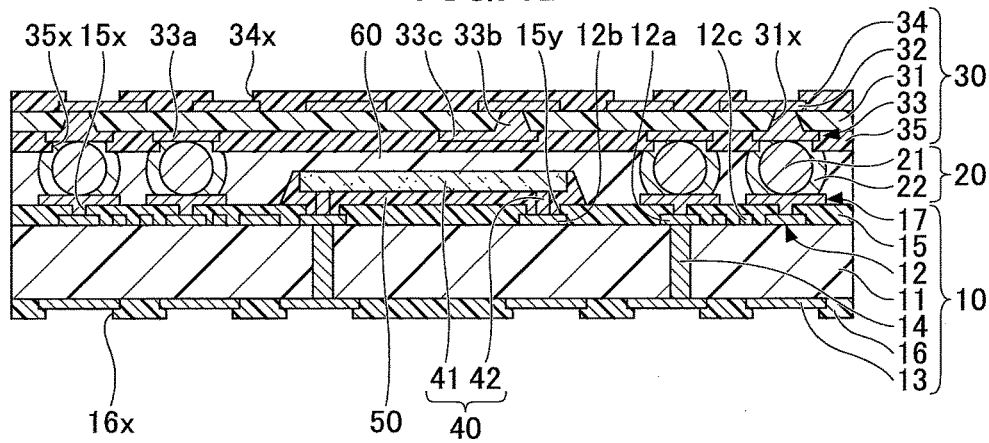

Next, in a step illustrated in FIG. 4D, after the conductive materials 22 are cured, the mold resin 60 is filled between the first substrate 10 and the second substrate 30 to seal the substrate connection members 20, the semiconductor chip 40 and the underfill resin 50. For the mold resin 60, insulating resin such as thermosetting epoxy based resin containing fillers may be used, for example. The mold resin 60 may be formed by transfer molding using a sealing die, for example.

After the step illustrated in FIG. 4D, as necessary, by forming the external connection terminals 90 such as solder balls at the wiring layer 13 that is exposed in the open portions 16x, the electronic component integrated substrate 1 illustrated in FIG. 1 is completed.

Although an example is described in the above steps, in which the single second substrate 30 is mounted on the single first substrate 10, a sheet first substrate provided with a plurality of areas each becomes the first substrate 10 may be prepared. Then, the second substrate 30 may be mounted on each of the areas of the sheet first substrate, and may be individualized after being sealed by the mold resin 60. Alternatively, a sheet second substrate provided with a plurality of areas each becomes the second substrate 30, where the number of the areas is smaller than the number of the areas of the sheet first substrate, may be prepared. Then, a plurality of the sheet second substrates may be mounted on the single sheet first substrate, and may be individualized after being sealed by the mold resin 60. In such a case as well, by enlarging the diameter of the connection pad 17a, the allowable amount of the positional shift between each of the first substrates 10 and each of the second substrates 30 can be increased.

Second Embodiment

In a second embodiment, an example is described in which substrate connection members that are different from those of the first embodiment are used. It is to be noted that, in the explanation of the drawings in the second embodiment, the same components that are already described in the above embodiment are given the same reference numerals, and explanations are not repeated.

Figure 5A:
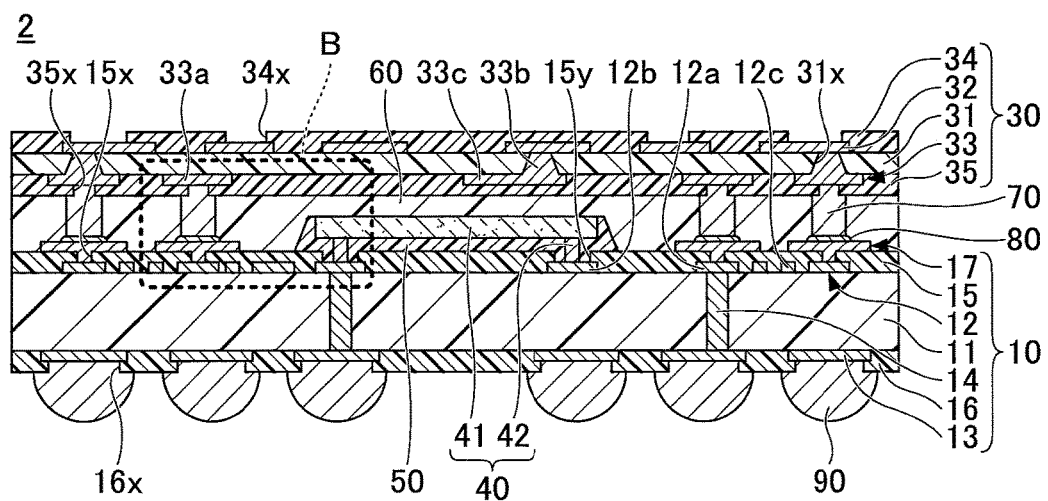
FIG. 5A and FIG. 5B are cross-sectional views illustrating an example of a component integrated substrate of a second embodiment.
Figure 5B:
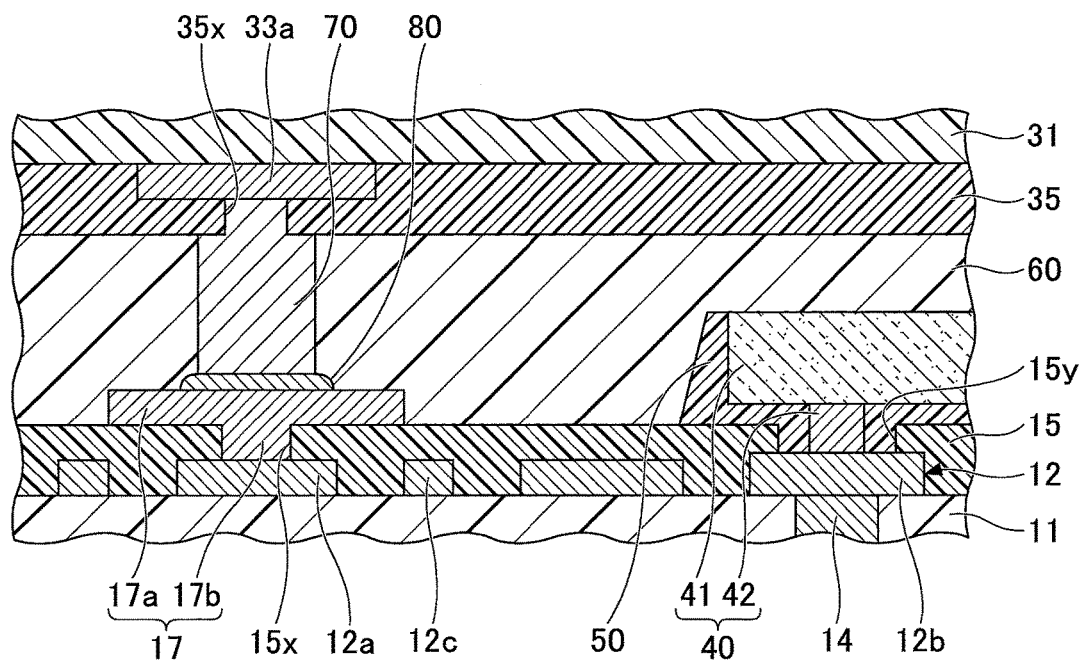

FIG. 5A and FIG. 5B are cross-sectional views illustrating an example of an electronic component integrated substrate 2 of the second embodiment, wherein FIG. 5B is a view in which a portion "B" of FIG. 5A is enlarged. With reference to FIG. 5A and FIG. 5B, the electronic component integrated substrate 2 of the second embodiment is different from the electronic component integrated substrate 1 of the first embodiment (see FIG. 1) in that the substrate connection members 20 are substituted by substrate connection members 70.

The substrate connection member 70 is a conductive member having a columnar shape (a cylindrical shape, for example), and a metal post such as a copper post may be used for the substrate connection member 70, for example. The substrate connection member 70 has a columnar shape in which the height is longer than the diameter. Further, the substrate connection member 70 is formed to be higher than the thickness of the connection pad 17a, the first pad 12a or the second pad 33a. Although the height of the connection pad 17a is limited in order not to influence in a mounting step of the semiconductor chip 40, the substrate connection member 70 does not have such a limitation. Thus, the substrate connection member 70 can be made higher than the connection pad 17a.

One end of the substrate connection member 70 is directly bonded to the second pad 33a exposed in the respective open portion 35x of the solder resist layer 35. Further, the other end of the substrate connection member 70 is bonded to the connection pad 17a via a connection layer 80. For the connection layer 80, a solder material similar to the conductive material 22 may be used, for example.

The diameter of the substrate connection member 70 may be about 50 to 135 µm, for example. The height of the substrate connection member 70 may be about 75 to 200 µm, for example. As the substrate connection member 70 has a columnar shape, it is possible to make the diameter of the substrate connection member 70 to be smaller than that of the substrate connection member 20, having a substantially spherical shape, even when retaining the same height as the substrate connection member 20. In accordance with this, the diameters of the second pad 33a and the open portion 35x, respectively, can be made smaller than those of the first embodiment. The diameter of the second pad 33a may be about 60 to 80 µm, for example. Further, the diameter of the open portion 35x may be about 40 to 60 µm, for example.

It is preferable that the diameter of the substrate connection member 70 is larger than the diameter of the open portion 35x. Further, it is preferable that the diameter of the substrate connection member 70 is larger than the diameter of the open portion 15x. With these relationships, the connection area of the substrate connection member 70 and the connection pad 17a is increased. Further, it is preferable that the diameter of the connection pad 17a is larger than the diameter of the substrate connection member 70. With this, the allowable amount of the positional shift when mounting the second substrate 30 on the first substrate 10 can be increased. With this, the reliability in connection between the first substrate 10 and the second substrate 30 is improved.

The substrate connection members 70 may be formed on the second pads 33a that are exposed in the open portions 35x of the solder resist layer 35 of the second substrate 30, respectively, in the step illustrated in FIG. 4B of the first embodiment.

Specifically, first, a seed layer is formed at the entire surface of the solder resist layer 35 including insides of the open portions 35x by a sputtering method or the like. For the seed layer, a stacked layer film in which a copper film is stacked on a titanium film may be used, for example.

Figure 6:
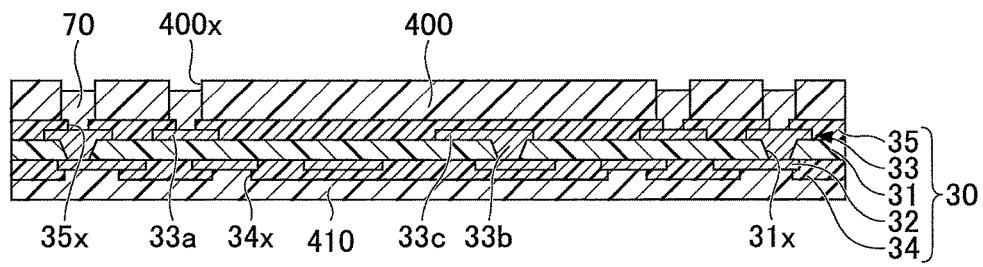
FIG. 6 is a view illustrating an example of manufacturing steps of the electronic component integrated substrate of the second embodiment.

Next, as illustrated in FIG. 6, a photosensitive resist layer 400 is formed on the entire surface of the seed layer (not illustrated in the drawings). Further, a resist layer 410 is formed on the entire surface of the solder resist layer 34. Then, open portions 400x are formed in the resist layer 400 by exposing and developing to expose parts of the seed layer, at which the substrate connection members 70 are formed, in the open portions 400x, respectively. Open portions are not provided in the resist layer 410. Next, an electrolytic plating made of copper (Cu) or the like is deposited on the seed layer exposed in the open portions 400x by electroplating using the seed layer as a power supply layer to form an electrolytic plating layer.

After the step illustrated in FIG. 6, the resist layer 400 is removed and the seed layer that is not covered by the electrolytic plating layer is removed by etching by using the electrolytic plating layer as a mask. Thereafter, the resist layer 410 is removed. With this, the substrate connection members 70 in which the electrolytic plating layer is stacked on the seed layer are formed. As necessary, upper surfaces of the substrate connection members 70 may be flattened by Chemical Mechanical Polishing (CMP) or the like. The substrate connection member 70 formed by the above described manufacturing steps has a structure in which the electrolytic plating layer is stacked on the seed layer. However, in each of the drawings, the seed layer is not illustrated.

In order to stack the second substrate 30 on the first substrate 10, first, a paste solder material that becomes the connection layer 80 is coated on the connection pad 17a of the substrate connection portion 17 of the first substrate 10. Alternatively, the paste solder material that becomes the connection layer 80 may be coated on a front end of the substrate connection member 70. Alternatively, a paste solder material that becomes the connection layer 80 may be coated on both of the connection pad 17a of the substrate connection portion 17 of the first substrate 10 and the front end of the substrate connection member 70.

Next, the second substrate 30 is stacked on the first substrate 10 such that a lower end portion of each of the substrate connection members 70 contacts the upper surface of the respective connection pad 17a. This means that the second substrate 30 is stacked on the first substrate 10 such that the semiconductor chip 40 and the underfill resin 50, and the substrate connection members 70 face with each other at inside.

Then, while heating the solder materials, that become the connection layers 80, respectively, the second substrate 30 is pushed toward the first substrate 10. With this, the first substrate 10 and the second substrate 30 are electrically connected with each other via the substrate connection members 70 while the lower end portion of the substrate connection member 70 contacting the respective upper surface of the connection pad 17a of the first substrate 10. Further, a predetermined space is retained between the first substrate 10 and the second substrate 30 by each of the substrate connection members 70. Thereafter, the mold resin 60 is filled between the first substrate 10 and the second substrate 30.

As such, according to the electronic component integrated substrate 2 of the second embodiment, as the substrate connection member 70 has a columnar shape, it is possible to make the diameter of the substrate connection member 70 smaller than that of the substrate connection member 20, which has a substantially spherical shape, of the electronic component integrated substrate 1. With this, the adjacent substrate connection members 70 can be formed in a narrow pitch.

Further, dimensions of the substrate connection member 70 that contact the second pad 33a and the connection pad 17a, respectively, can be made larger than dimensions of the core 21 of the substrate connection member 20 that contact the second pad 33a and the connection pad 17a, respectively. With this, it is possible to connect the first substrate 10 and the second substrate 30 with a low resistance, and reliability in electrical connection can be improved. Other effects are the same as those of the first embodiment.

(Applied Example of First Embodiment)

In an applied example of the first embodiment, an example of an electronic component device is described in which a semiconductor package is mounted on the electronic component integrated substrate 1 of the first embodiment. It is to be noted that, in the explanation of the drawings in the applied example of the first embodiment, the same components that are already described in the above embodiment are given the same reference numerals, and explanations are not repeated.

Figure 7:
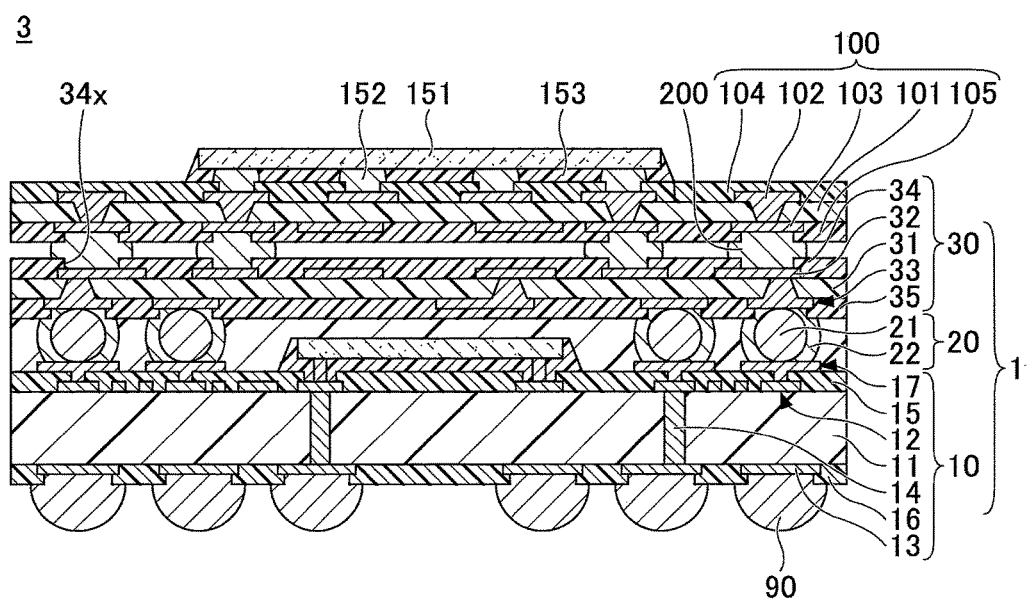
FIG. 7 is a cross-sectional view illustrating an example of an electronic component device of an applied example of the first embodiment.

FIG. 7 is a cross-sectional view illustrating an example of an electronic component device 3 of an applied example of the first embodiment. With reference to FIG. 7, the electronic component device 3 includes the electronic component integrated substrate 1 as illustrated in FIG. 1A, a semiconductor package (including a wiring substrate 100, a semiconductor chip 151, bumps 152 and underfill resin 153) and bumps 200.

The wiring substrate 100 includes an insulating layer 101, wiring layers 102 and 103 and solder resist layers 104 and 105. The wiring layer 102 and the wiring layer 103 are electrically connected with each other by via wirings formed in the insulating layer 101. The semiconductor chip 151 is connected to (flip-chip mounted) portions of the wiring layer 102 (pads) exposed from the solder resist layer 104 via the bumps 152, respectively. The underfill resin 153 is filled between the semiconductor chip 151 and the upper surface of the wiring substrate 100.

Portions of the wiring layer 103 (pads) exposed from the solder resist layer 105 of the wiring substrate 100 on which the semiconductor chip 151 is flip-chip mounted are connected to the wiring layer 32 (pads) exposed in the open portions 34x of the solder resist layer 34 of the electronic component integrated substrate 1 via the bumps 200, respectively.

As such, by mounting the semiconductor package on the electronic component integrated substrate 1 of the first embodiment, the electronic component device 3 can be actualized.

Figure 8:
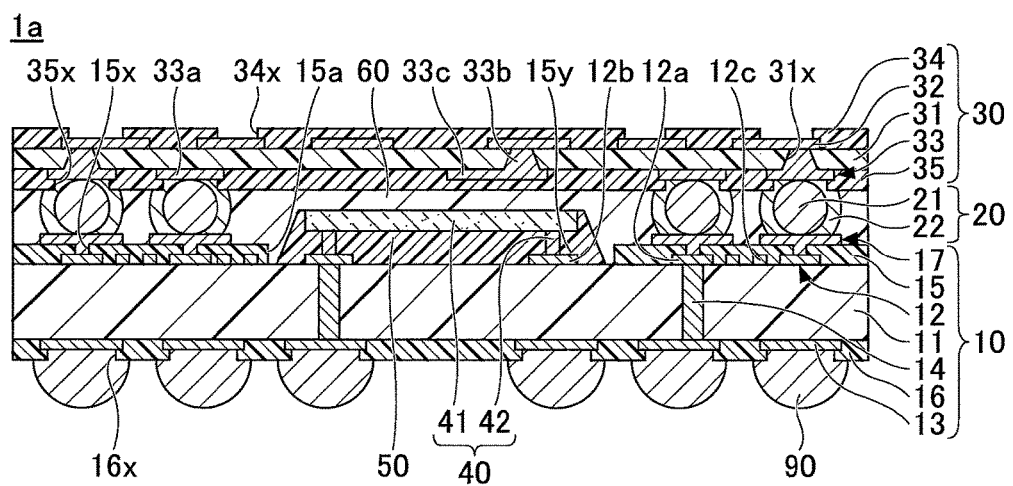
FIG. 8 is a cross-sectional view illustrating an example of an electronic component device of an applied example of the first embodiment.

FIG. 8 is a cross-sectional view illustrating an example of an electronic component device 1a of an applied example of the first embodiment. The electronic component device 1a of FIG. 8 is different from the electronic component device 1 of FIG. 1A in that the solder resist layers 15 is provided with an open portion 15a for exposing the surface of the insulating layer 11 at which the semiconductor chip 40 is mounted. The insulating layer 11 and all of the connection pads 12b are exposed from the solder resist layers 15 within the open portion 15a. Then, the connection pads 12b are covered by the underfill resin 50.

With this structure, a space for filling the underfill resin 50 can be ensured at the area for mounting the semiconductor chip 40. Thus, the mounted height of the semiconductor chip 40 can be decreased and the electronic component device 1a can be made thin.

According to the disclosed technique, an electronic component integrated substrate capable of ensuring a clearance between pads of a first substrate can be provided.

Although a preferred embodiment of the electronic component integrated substrate has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, for the first substrate or the second substrate, a build-up substrate in which more layers of wiring layers and insulating layers are formed may be used. In such a case, a coreless build-up substrate or the like may be used. Alternatively, for the first substrate or the second substrate, a silicon substrate, a ceramic substrate or the like may be used.

What is claimed is:

1. An electronic component integrated substrate comprising:
    a first substrate including
        a first pad,
        a first solder resist layer that is formed as an outermost insulating layer of the first substrate on the first pad and provided with a first open portion that selectively exposes the first pad, and
        a connection pad formed on the first solder resist layer, and electrically connected to the first pad via a conductive material provided in the first open portion;
    a second substrate including
        a second pad, and
        a second solder resist layer formed on the second pad and provided with a second open portion that selectively exposes the second pad,
    the second substrate being stacked on the first substrate while facing the second pad toward the connection pad;
    an electronic component mounted on the first substrate and sandwiched between the first substrate and the second substrate; and
    a substrate connection member that electrically connects the connection pad and the second pad with each other,
    the diameter of the connection pad being larger than each of the diameter of the first pad and the diameter of the second open portion.

2. The electronic component integrated substrate according to claim 1, wherein the diameter of the second open portion is larger than the diameter of the first pad.

3. The electronic component integrated substrate according to claim 1, further comprising resin that is filled between the first substrate and the second substrate to seal the substrate connection member and the electronic component, the resin covering a side surface of the connection pad.

4. The electronic component integrated substrate according to claim 1, further comprising:
    a plurality of the first pads; and
    a wiring pattern provided between the adjacent first pads.

5. The electronic component integrated substrate according to claim 1, further comprising a second connection pad for being electrically connected to the electronic component at a same layer level as the first pad,
    wherein the first solder resist layer is formed on the second connection pad and is provided with a third open portion that selectively exposes the second connection pad, and
    wherein the electronic component is electrically connected to the second connection pad via a conductive material provided in the third open portion.

6. The electronic component integrated substrate according to claim 1,
    wherein the substrate connection member includes a core and a conductive material that covers a circumferential surface of the core, and
    wherein the core contacts the connection pad and the second pad, respectively.

7. The electronic component integrated substrate according to claim 1,
    wherein the electronic component is a semiconductor chip, and
    wherein the semiconductor chip is flip-chip mounted while facing a circuit forming surface to the first substrate.

* * * * *